United States Patent
Frede

(10) Patent No.: US 11,543,435 B2
(45) Date of Patent: Jan. 3, 2023

(54) MEASUREMENT SYSTEM AND METHOD FOR RECORDING CONTEXT INFORMATION OF A MEASUREMENT

(71) Applicant: Rohde & Schwarz GmbH & Co. KG, Munich (DE)

(72) Inventor: Tobias Frede, Groebenzell (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 536 days.

(21) Appl. No.: 16/717,310

(22) Filed: Dec. 17, 2019

(65) Prior Publication Data

US 2020/0241048 A1     Jul. 30, 2020

(30) Foreign Application Priority Data

Jan. 25, 2019 (EP) .................................. 19153674

(51) Int. Cl.
| | |
|---|---|
| *G01R 13/20* | (2006.01) |
| *H04B 17/30* | (2015.01) |
| *G01R 13/22* | (2006.01) |
| *G10L 15/08* | (2006.01) |
| *G10L 15/22* | (2006.01) |

(52) U.S. Cl.
CPC .......... *G01R 13/204* (2013.01); *G01R 13/22* (2013.01); *G10L 15/08* (2013.01); *G10L 15/22* (2013.01); *H04B 17/30* (2015.01)

(58) Field of Classification Search
CPC .. G01R 13/0218; G01R 13/04; G01R 13/204; G01R 13/22; G10L 15/08; G10L 15/22; H04B 17/30
See application file for complete search history.

(56) References Cited

U.S. PATENT DOCUMENTS

| | | | |
|---|---|---|---|
| 5,953,684 A * | 9/1999 | Alexander | G01R 31/31908 702/108 |
| 6,921,336 B1 * | 7/2005 | Best | A63F 13/10 463/40 |

(Continued)

FOREIGN PATENT DOCUMENTS

| | | |
|---|---|---|
| EP | 3 079 090 A1 | 10/2016 |
| EP | 3 144 688 A2 | 3/2017 |
| EP | 3 379 268 A1 | 9/2018 |

OTHER PUBLICATIONS

Extended European search report for European Patent Application No. 19153674.7, dated Jul. 10, 2019, search completed Jul. 2, 2019, 11 pages.

(Continued)

*Primary Examiner* — Michael B. Pierorazio
(74) *Attorney, Agent, or Firm* — Westman, Champlin & Koehler, P.A.

(57) ABSTRACT

The present invention relates to an improved recording of context information for a measurement. For this purpose, it is suggested to receive context information from a user and to generate a dataset comprising the received context information. The context information may comprise one or more voice annotation. By using voice annotations for specifying context information of a measurement, a very simple and easy format for acquiring the context information from a user is achieved.

18 Claims, 3 Drawing Sheets

(56) References Cited

U.S. PATENT DOCUMENTS

Figure 1:
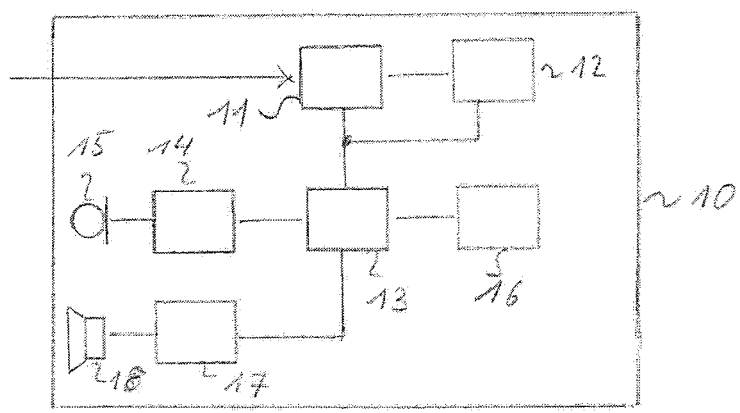

| | | | | |
|---|---|---|---|---|
| 7,712,125 B2* | 5/2010 | Herigstad | H04N 21/4755 | 725/38 |
| 7,931,535 B2* | 4/2011 | Ikeda | A63F 13/98 | 463/31 |
| 7,942,745 B2* | 5/2011 | Ikeda | A63F 13/235 | 463/31 |
| 7,974,535 B2* | 7/2011 | Nakamura | G08C 23/04 | 398/107 |
| 8,531,050 B2* | 9/2013 | Barney | A63F 13/825 | 345/158 |
| 8,698,746 B1* | 4/2014 | Merrick | G06F 3/038 | 345/157 |
| 8,740,708 B2* | 6/2014 | Karacal | A63F 13/245 | 463/47 |
| 8,753,205 B2* | 6/2014 | Kando | G06F 3/04815 | 463/31 |
| 8,830,170 B2* | 9/2014 | Kao | G06F 3/0325 | 345/169 |
| 9,011,248 B2* | 4/2015 | Ikeda | A63F 13/98 | 463/38 |
| 9,807,471 B2* | 10/2017 | Kim | H04N 21/42202 | |
| 9,894,415 B2* | 2/2018 | Knox | H04N 21/44218 | |
| 2002/0162120 A1* | 10/2002 | Mitchell | H04N 21/8586 | 725/135 |
| 2003/0216177 A1* | 11/2003 | Aonuma | A63F 13/5372 | 463/32 |
| 2005/0210502 A1* | 9/2005 | Flickinger | H04N 21/2668 | 725/35 |
| 2006/0041472 A1* | 2/2006 | Lukose | G06Q 30/0275 | 705/14.66 |
| 2007/0022437 A1* | 1/2007 | Gerken | H04N 21/4348 | 348/E7.071 |
| 2007/0052177 A1* | 3/2007 | Ikeda | A63F 13/24 | 273/317 |
| 2007/0060391 A1* | 3/2007 | Ikeda | A63F 13/24 | 463/46 |
| 2007/0124775 A1* | 5/2007 | DaCosta | H04N 21/6582 | 348/E7.071 |
| 2007/0271580 A1* | 11/2007 | Tischer | H04H 60/07 | 725/35 |
| 2008/0082510 A1* | 4/2008 | Wang | H04H 60/40 | |
| 2008/0153593 A1* | 6/2008 | Ikeda | A63F 13/24 | 463/37 |
| 2008/0178241 A1* | 7/2008 | Gilboy | H04N 21/6587 | 348/E7.071 |
| 2009/0067847 A1* | 3/2009 | Nakamura | G08C 23/04 | 398/128 |
| 2009/0082691 A1* | 3/2009 | Denison | A61B 5/30 | 600/544 |
| 2009/0163274 A1* | 6/2009 | Kando | A63F 13/577 | 463/31 |
| 2009/0195392 A1* | 8/2009 | Zalewski | G06F 3/017 | 340/573.1 |
| 2009/0249388 A1* | 10/2009 | Seidel | H04N 21/812 | 725/32 |
| 2010/0192173 A1* | 7/2010 | Mizuki | H04N 21/4312 | 725/115 |
| 2010/0199318 A1* | 8/2010 | Chang | H04N 21/44209 | 725/97 |
| 2011/0172016 A1* | 7/2011 | Ikeda | A63F 13/98 | 463/37 |
| 2011/0190052 A1* | 8/2011 | Takeda | A63F 13/213 | 463/31 |
| 2011/0247042 A1* | 10/2011 | Mallinson | G06F 16/487 | 725/86 |
| 2012/0046767 A1* | 2/2012 | Shimohata | A63F 13/65 | 700/91 |
| 2012/0133582 A1* | 5/2012 | Ohsawa | G06F 3/0325 | 345/157 |
| 2012/0192222 A1* | 7/2012 | Kumar | H04N 21/812 | 725/32 |
| 2012/0192228 A1* | 7/2012 | Zito | G06F 16/735 | 725/34 |
| 2012/0309515 A1* | 12/2012 | Chung | H04N 21/812 | 463/31 |
| 2013/0171897 A1* | 7/2013 | Hsu Tang | B32B 5/20 | 442/76 |
| 2013/0238413 A1* | 9/2013 | Carlson | G06Q 20/321 | 705/14.25 |
| 2013/0335226 A1* | 12/2013 | Shen | A63F 13/25 | 340/669 |
| 2014/0052513 A1* | 2/2014 | Ryan | G06Q 30/0255 | 705/14.16 |
| 2014/0168071 A1* | 6/2014 | Ahmed | H04N 5/23206 | 345/156 |
| 2014/0309511 A1* | 10/2014 | Stal | G16H 20/10 | 600/595 |
| 2015/0121418 A1* | 4/2015 | Jain | H04N 21/44213 | 725/32 |
| 2015/0296273 A1* | 10/2015 | Kim | H04N 21/4781 | 725/32 |
| 2015/0301085 A1* | 10/2015 | Bryson | G01R 13/0254 | 702/66 |
| 2016/0021425 A1* | 1/2016 | Eriksson | G06T 11/206 | 725/10 |
| 2016/0287142 A1* | 10/2016 | Han | A61B 5/6804 | |
| 2017/0078544 A1* | 3/2017 | Ringsrud | H04N 5/33 | |
| 2017/0078545 A1* | 3/2017 | Kearsley | H04N 5/2257 | |
| 2017/0307678 A1* | 10/2017 | Diegmann | G01R 13/0218 | |
| 2017/0374414 A1* | 12/2017 | Knox | H04N 21/41407 | |
| 2018/0109828 A1* | 4/2018 | Knox | H04N 21/4532 | |
| 2018/0115802 A1* | 4/2018 | Knox | H04N 21/4223 | |
| 2018/0124458 A1* | 5/2018 | Knox | G06V 40/174 | |
| 2018/0124459 A1* | 5/2018 | Knox | G06V 40/20 | |
| 2018/0275241 A1* | 9/2018 | Frede | G01R 13/06 | |
| 2019/0069145 A1* | 2/2019 | Dantsker | G10L 15/30 | |
| 2019/0122766 A1* | 4/2019 | Strader | G06F 16/3344 | |

OTHER PUBLICATIONS

Loyd, Douglas B. et al., "An Audio- and Speech-Based Interface for Computer-Controlled Scientific Instruments", IEEE Transactions On Rehabilitation Engineering, vol. 7, No. 2, Jun. 1999, 1063-6528/99s10.00 © 1999 IEEE, BNSDOCID: <XP_11053954A_I_>, 9 pages.

Miao, Fen et al., "A Wearable Context-Aware ECG Monitoring System Integrated with Built-in Kinematic Sensors of the Smartphone", article, Open Access sensors, ISSN 1424-8220, www.mdpi.com/journal/sensors, Sensors 2015, 15, 11465-11484; doi: 10-3390/s150511465, Published May 19, 2015, BNSDOCID: <XP_5S246419A_I_>, 20 pages.

* cited by examiner

MEASUREMENT SYSTEM AND METHOD FOR RECORDING CONTEXT INFORMATION OF A MEASUREMENT

CROSS-REFERENCE TO RELATED APPLICATION

This application claims priority to European Patent Application No. 19153674.7, filed on Jan. 25, 2019, the content of which is hereby incorporated by reference.

TECHNICAL FIELD

The present invention relates to a measurement system for recording context information of a measurement. The present invention further relates to a method for recording context information of a measurement.

BACKGROUND

Although applicable in principle to any measurement system, the present invention and its underlying problem will be hereinafter described in combination with a measurement configuration of an oscilloscope.

When performing a measurement, the measurement result has to be taken into account in combination with further conditions specifying the configuration of a test set. For this purpose, a user may draw-up a report of a measurement scenario comprising the measurement results, a configuration of the measurement devices and an overall setup of the measurement arrangement. For example, such a report may comprise one or more screenshots of an oscilloscope, a documentation of the setting of the oscilloscope and a further description, for example a specification of input signals provided to a device under test, a setting of the device under test etc. Further remarks regarding the test setting may be also possible.

As can be seen from this, a documentation of a test scenario may be a complex and time-consuming task. Furthermore, all relevant data, for example the screenshots of the measurement, the setting of the measurement device and the configuration of the device under test may come from different sources and have to be combined together for a meaningful report.

Against this background, there is a need to provide a system and a method for recording context information of a measurement in which all relevant information of the measurement can be put together. In particular, the present invention aims to provide a simple recording of context information related to a measurement.

SUMMARY

The present invention provides a measurement system and a method having the features of the independent claims. Further advantageous embodiments are subject-matter of the dependent claims.

According to a first aspect, a measurement system for recording context information of a measurement is provided. The system comprises a signal measurement device, an input device and a processor. The signal measurement device is adapted to receive an electrical signal. The signal measurement device is further adapted to analyze the received electrical signal. The input device is adapted to receive context information. In particular, the context information may be received from a user. The received context information may relate to the measurement performed by the signal measurement device. The processor is adapted to generate a dataset comprising context information received by the input device. The processor is further adapted to store the generated dataset. For example, the generated dataset may be stored in a local or remote database.

According to a further aspect, a method for recording context information of a measurement is provided. The method comprises a step of receiving an electrical signal and a step of analyzing the received electrical signal. In particular, the reception and the analysis of the electrical signal may be performed by a signal measurement device. The method further comprises a step of receiving context information. The context information may relate to the analysis of the received electrical signal. In particular, the context information may be received from a user. The method further comprises generating a dataset comprising the received context information. Finally, the method comprises storing the generated dataset. In particular, the generated dataset may be stored in a local or remote database.

The present invention is based on the fact that recording relevant information related to a measurement process may be a complex and time-consuming task. In particular, if all relevant information have to be recorded in text form, inputting the relevant data may require a long time period. This may lead to the fact that a user may not record all relevant information of a measurement process.

The present invention takes into account this fact and aims to provide a convenient and simple recording of context information of a measurement. It is for this purpose that the relevant context information may be received from a user in any appropriate manner, and the received context information may be automatically combined to a dataset for documentation purposes. By combining the relevant data, in particular the setting of the measurement device and further context information received from a user to a single dataset, the generated dataset may comprise all relevant data of the measurement process. In this way, the measurement operation can be easily understood and analyzed at a later point of time.

The signal measurement device of the measurement system may be any appropriate device, which can receive and analyze an electrical signal. For example, a measurement signal may be received by an input port of the signal measurement device. The signal measurement device may comprise any kind of element for receiving and analyzing the electric signal at the input port. For example, the signal measurement device may comprise elements such as filters, attenuators, amplifiers, analogue-to-digital converters, a mixer, a demodulator or the like. The signal measurement device may analyze and/or record the received electrical signal over a predetermined period of time. Accordingly, the signal measurement device may provide a signal waveform of the received electrical signal on a display. However, it is understood that any other kind of analysis of a received electrical signal may be possible, too.

For performing the measurement, i.e. reception and analysis of the electrical signal, the signal measurement device may be set according to specific parameters. The specific parameters may comprise a number of settings of the signal measurement device. For example, a range, a sensitivity, a predetermined trigger event or any other parameter may be set for a desired measurement. Accordingly, a measurement of the signal measurement device may be performed based on the specified settings.

In addition to the measurement result and the settings of the signal measurement device, a user may provide additional information in conjunction with the desired measurement. This additional information may be considered as context information. The context information may relate to any appropriate information, which might be relevant in connection with the measurement operation. For example, a user may specify a device under test by characterizing the type of the device under test, a serial number or the like. Furthermore, a particular configuration of the device under test may be specified, input signals provided to the device under test or one or more characteristic parameters of a setting applied to the device under test may be specified. Furthermore, it may be possible to specify environmental parameters, for example temperature, humidity, or interfering conditions etc.

The relevant context information may be provided by a user in any appropriate form. For example, the user may enter the context information in text form by a keyboard or touch-screen. However, any other appropriate manner for entering the context information may be possible. For example, the context information may be provided as one or more voice notes, which will be described in more detail below.

In order to obtain a well-defined report of the measurement operation, the context information provided by the user may be combined with further data of the measurement system, for example a number of one or more predetermined setting parameters of the signal measurement device and/or a measurement result such as an analysis provided by the signal measurement device. In this way, it is possible to obtain a dataset comprising all relevant information related with a measurement procedure. Thus, it is possible to easily analyze the measurement operation at a later point of time.

Further embodiments of the present invention are subject of the further sub-claims and of the following description referring to the drawings.

In a possible embodiment, the generated context information comprises predetermined settings of the signal measurement device. Accordingly, the processor of the measurement system may generate context information comprising the predetermined settings of the signal measurement device and context information received by the input device. In a possible embodiment, the input device comprises an audio interface. The audio interface may be adapted to receive a voice annotation. Accordingly, the context information may comprise the received voice annotations.

By providing context information from a user in form of voice annotations, the user can provide the relevant information in a manner, which is very easy and convenient for the user. In particular, there is no need for a complex input of the context information in text form or the like. Hence, the context information can be provided very quick and easily by providing voice annotations, e.g. in form of voice notes.

In a possible embodiment, the processor is adapted to include multiple voice annotations to a dataset.

By including multiple voice annotations to a dataset for specifying a measurement procedure, it is possible to add further information in the later point of time. Furthermore, it is also possible that multiple users may provide separate voice annotations, which can be included to a dataset for specifying a measurement operation.

In a possible embodiment, the measurement system comprises a microphone. The microphone may be adapted to be connected to the input device. In this way, the voice annotations can be easily provided by recording the voice annotations via the microphone.

The microphone may be a microphone, which is firmly included in the measurement system in particular in an apparatus comprising the signal measurement device, the input device and processor. However, it may be also possible to provide the voice annotations to the input device via a wireless microphone and a wireless communication link. Furthermore, the microphone may be connected to the input device via a cable. In particular, the microphone with a cable may be connected to a terminal of the input device.

In a possible embodiment, the measurement system comprises an audio interface. The audio interface may be adapted to provide an audio signal corresponding to the voice annotations of the context information. For example, the audio interface may convert digital recorded data of a voice annotation to analogue signals. The audio signal may be provided to any appropriate audio output device via a wired or wireless communication link.

In a possible embodiment, the measurement system comprises a loudspeaker. The loudspeaker may be adapted to be connected to the audio interface. In this way, the audio signal provided by the audio interface may be reproduced and provided to a user. The loudspeaker may be directly connected to the audio interface. Alternatively, it may be also possible to connect the loudspeaker to the audio interface via a cable, e.g. using a connection comprising a plug and a socket. For example, the loudspeaker may be a loudspeaker already included in the measurement system for other purposes, for example for signaling a particular state or the like.

In a possible embodiment, the measurement system comprises a wireless communication interface. The wireless communication interface may be adapted to transmit a stored dataset to a remote device. Additionally or alternatively, the wireless communication link may be adapted to receive a modified dataset from a remote device.

The communication link between the wireless communication interface and the remote device may be any kind of a wireless communication link, for example a near field communication, a WLAN or a Bluetooth communication. In this way, the dataset including the context information, in particular the voice annotations may be easily provided to a remote device for further operations.

In a possible embodiment, the measurement system may comprise a remote device. The remote device may be adapted to receive datasets including context information, to modify the context information, to reproduce context information and/or to transmit context information to the wireless communication interface of the measurement system. In particular, the context information may be included in a dataset.

By receiving, processing and transmitting the context information on a remote device, the user can easily deal with the related context information. For example, the user can reproduce context information, in particular the voice annotations, modify the voice annotations, at further voice annotations, etc. For example, the remote device may be a smartphone, a tablet computer or the like.

In a possible embodiment, the dataset comprises a display screenshot, in particular a display screenshot provided by the signal measurement device. Additionally or alternatively, the dataset may comprise measurement trace data, measurement samples or any further data related with the measurement. In particular, the data may be provided in compressed or expanded form. Measurement trace data may comprise, for instance, data describing a history of a measurement process.

In a possible embodiment, the measurement system comprises an internal memory for storing the datasets. Additionally or alternatively, the system may comprise an external memory, in particular a removable memory for storing the datasets. Furthermore, the system may comprise a communication link to a remote memory for storing the datasets. Accordingly, the processor will be adapted to store the datasets in the internal memory, the removal memory and/or via the communication link to the remote memory.

For example, the external memory may be a secured data (SD) card, a USB stick or the like. The remote memory may be a memory of a remote server, for example, a storage device of a cloud or the like.

In a possible embodiment, the measurement system comprises a control device. The control device may be adapted to receive a selection of a dataset out of the stored datasets. The control device may be further adapted to initiate an output of at least one piece of context information related to the selected dataset. In this way, the information stored in the individual datasets may be easily provided to the user.

In a possible embodiment, the signal measurement device may comprise an oscilloscope. However, it is understood that any other appropriate measurement device may be possible, too.

In a possible embodiment of the method for recording context information, the context information may comprise at least two voice annotations. By including multiple voice annotations to a dataset, it is possible to add context information from different users and/or at different points in time.

In a possible embodiment of the method, the method comprises a step of receiving a selection of a dataset stored in the database and a step of reproducing at least one of the voice annotations of the selected dataset.

With the present invention it is therefore now possible to combine measurement data, settings and additional annotations in a single dataset. In particular, the dataset may comprise different types of information. Accordingly, recording and documentation of a measurement process can be simplified. In this way, required time for documenting a measurement process can be saved and a user might be motivated to add further information, which could help understanding the measurement operation at a later point of time.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

BRIEF DESCRIPTIONS OF THE DRAWINGS

Figure 2:
Figure 3:
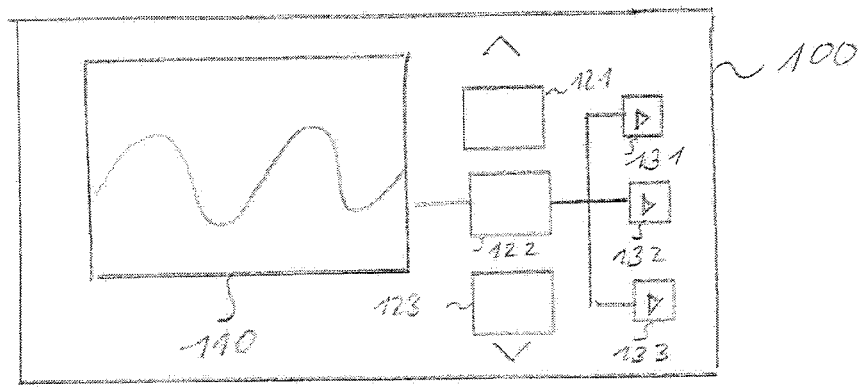
Figure 4:
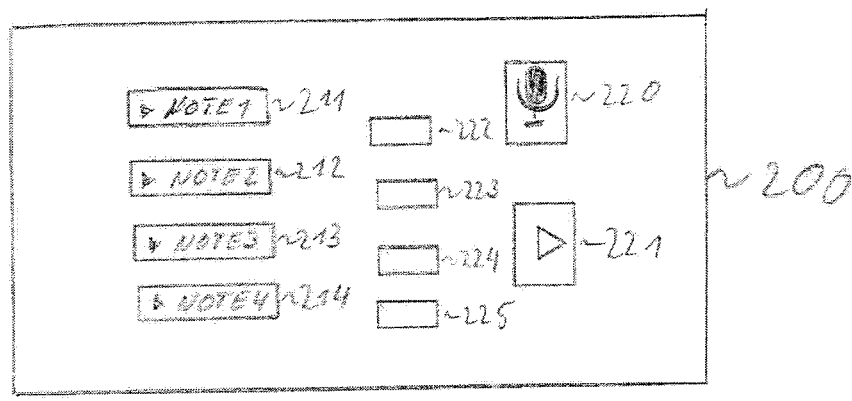
Figure 5:
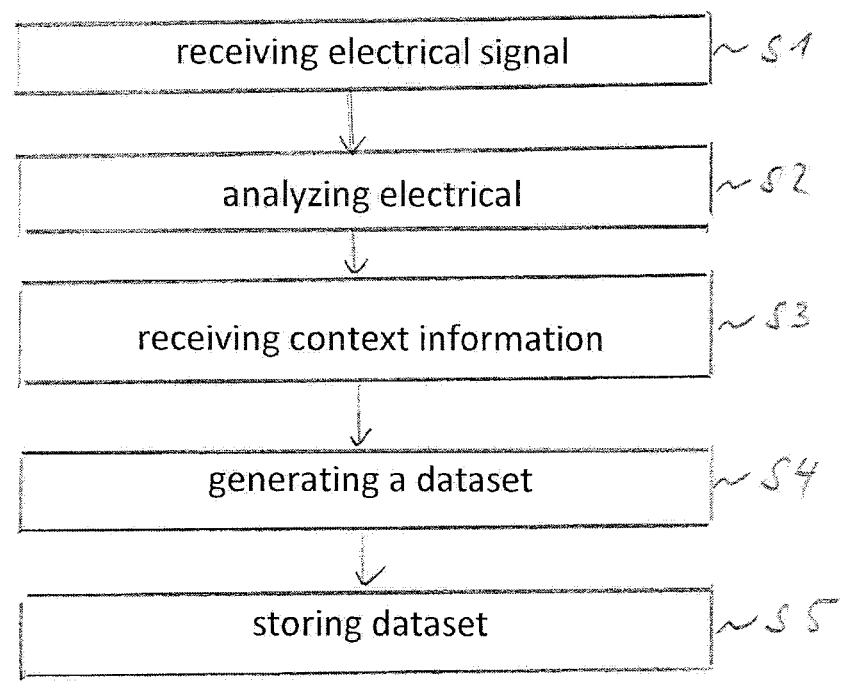

For a more complete understanding of the present invention and advantages thereof, reference is now made to the following description taking in conjunction with the accompanying drawings. The invention is explained in more detail below using exemplary embodiments, which are specified in the schematic figures of the drawings, in which:

FIG. 1: shows a block diagram of an embodiment of a measurement system according to the present invention;

FIG. 2: shows a block diagram of another embodiment of a measurement system according to the present invention;

FIG. 3: shows a schematic representation of a screen for presenting a dataset according to an embodiment;

FIG. 4: shows an exemplary screen for managing voice annotations according to an embodiment; and FIG. 5: shows a flow diagram of an embodiment of a method according to the present invention.

The appended drawings are intended to provide further understanding of the embodiments of the invention. They illustrate embodiments and, in conjunction with the drawings, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a block diagram of a measurement system 10 according to an embodiment. The measurement system comprises a signal measurement device 11 for receiving and analyzing electrical signals. Further, the measurement system comprises an input device 14 for receiving context information from a user, and a processor 13 for generating a dataset based on the received context information and predetermined settings of the signal measurement device 11. The generated dataset may be stored, for example in a memory 16.

Signal measurement device 11 may receive electrical signals from any kind of appropriate signal source. For example, the electrical signal may be provided from a probe tip, a measurement antenna or via a cable connection from a device under test. However, it is understood, that the present invention is not limited to such signal sources. Moreover, any kind of signal source for providing electrical signals may be possible. Signal measurement device 11 may receive and analyze the electrical signal. For this purpose, signal measurement device 11 may comprise any kind of appropriate elements or devices, for example a filter, an amplifier, an attenuator, a mixer, a demodulator etc. Furthermore, analogue signals may be converted to digital signals by an analogue-to-digital converter at a specific sampling rate and a specific resolution. The analysis may comprise sampling, recording and displaying a signal waveform of the electrical signal. Furthermore, the signal measurement device may determine one or more predetermined characteristic parameters of the electrical signal, for example a maximum value, a minimum value, an average value, a duty cycle etc. The result of the analysis may be displayed on a display 12 or any other appropriate output device.

Input device 14 may receive any kind of context information from a user. The context information may relate, for example, to further information in connection with the measurement procedure. For example, the context information may specify information in connection with a device under test, such as signals provided to the device under test, settings or configuration of the device under test, environmental parameters such as temperature or humidity, interferences or any other kind of information, which might be relevant in connection with the measurement.

The context information may be provided in any kind of appropriate form. For example, the context information may be entered by means of a keyboard or a touch-screen. However, any other method for providing context information may be possible, too. In particular, it is possible to provide the context information by means of voice annotations, i.e. a spoken note of a user.

In order to record a voice annotation, a microphone 15 may be connected to the input device 14 of the measurement system. The microphone 15 may be an internal microphone of the measurement system 10. Alternatively, it may be also possible to connect an external microphone 15 to the input device 14. For example, the external microphone 15 may be connected to the input device 14 by a plug and socket connection. Alternatively, it may be also possible to use a wireless connection between the microphone 15 and the input device 14. For example, the external microphone 15 may be a headset microphone or the like. However, any other kind of microphone may be possible, too.

The voice annotation may be recorded in any appropriate audio format. For example, the voice annotation may be recorded in a MP3 format, a WAV format or any other known or upcoming digital audio format.

Processor 13 may receive the context information, in particular the voice annotation. Further, processor 13 may determine further data related to the measurement operation. For example, processor 13 may determine a number of one or more predetermined settings of the signal measurement device 11. For example, the predetermined settings may comprise an attenuation or amplification factor, a specific range, filter characteristics, settings of a mixer or demodulator or any other parameter specifying the settings of the signal measurement device 11. Furthermore, processor 13 may receive data of a measurement result, for example a screenshot of the measurement results displayed on display 12. It may be also possible that processor 13 may receive a number of measurement samples in compressed or uncompressed form.

Processor 13 may combine the received context information and the further information to a dataset In particular, the data sets may comprise predetermined settings of the signal measurement device and/or the measurement results of the signal measurement device 11. The generated dataset may be stored, for example in an internal memory 16. Additionally or alternatively, it may be also possible to store the dataset in an external memory, for example a removable memory device such as an SD-card or an USB stick. Furthermore, it may be possible to transfer the generated dataset to a remote server, for example a storage device of a cloud.

The stored datasets with the context information may be reproduced upon request. For this purpose, a user may select a specific dataset and the data relating to the selected dataset may be output. For example, graphical data may be displayed on the screen 12 of the measurement system 10, and audio data such as the voice annotations may be provided via an audio interface 17. Audio interface 17 may convert the digital audio data to an analogue signal. For example, the audio signal may be provided by a plug or socket or any other kind of interface. A loudspeaker 18 or another device for reproducing the audio signals may be connected to audio interface 17. For example, the loudspeaker 18 may be an internal loudspeaker of the measurement system 10. In particular, a loudspeaker 18 may be a loudspeaker, which is already used in the measurement system for other purposes, for example for outputting acoustical signals or the like. However, it may be also possible to connect an external loudspeaker 18. For example, loudspeaker 18 may be a loudspeaker of a headset or any other kind of external loudspeaker. In this way, the data of a stored dataset, in particular the context information such as the voice annotations may be reproduced upon request.

FIG. 2 shows a block diagram of a measurement system 10 according to a further embodiment. Measurement system 10 may comprise some or all components as already described above in connection with FIG. 1. Further to this, measurement system 10 may comprise a remote device 20. For example, remote device 20 may be a wireless device such as a smartphone or a tablet computer. Remote device 20 may be connected via a wireless communication link. For this purpose, measurement system 10 may comprise a wireless interface 19. Accordingly, the data of one or more datasets may be transmitted via the wireless communication interface 19 to the remote device 20.

Remote device 20 may receive the data of one or more datasets. Remote device 20 may provide services such as reproducing the data of a dataset, in particular reproducing the context information of a dataset. For example, voice annotations may be output by a loudspeaker of the remote device 20. Furthermore, remote device 20 may be configured to modify a dataset, in particular the context information of a dataset. For example, an additional voice annotation may be added to a dataset or a voice annotation may be replaced by another voice annotation. Furthermore, it may be possible to add additional voice data to an already existing voice annotation. Any other method for modifying the context information of a dataset may be possible, too. Furthermore, it may be even possible to delete context information on the remote device 20. Remote device 20 may also transmit a dataset, in particular context information such as voice annotations from the remote device 20 to the wireless communication interface 19 for storing the dataset as described above.

FIG. 3 shows a schematic illustration of a screen 100 for operating with datasets comprising context information. The screen 100 may comprise, for example, a section for reproducing a screen shot 110 of a measurement. The reproduced screenshot 110 may be associated with a dataset 122 out of a number of datasets 121-123. Furthermore, dataset 122 may comprise a number of context information elements 131-133. For example, the context information elements 131-133 may relate to voice annotations. Accordingly, a user might select one of the voice annotations 131-133 for reproducing the audio signal of the voice annotations 131-133.

FIG. 4 shows a schematic representation of a screen 200 for dealing with voice annotations. In section 210 of the screen 200 a number of indications 211-214 are displayed. A user may go through this representation of voice annotations 111-114 and select a voice annotation for reproduction, modification or deletion. For this purpose, a number of further buttons, in particular soft buttons 221-225 might be displayed on the screen. Furthermore, a microphone symbol 220 might be displayed. Upon selecting the microphone symbol 220, a further voice annotation might be recorded.

It is understood that the above described examples of screens are only illustrative purposes without limiting the present invention. Furthermore, any other kind of arrangement on the screen may be possible for providing the recorded information or for recording context information.

FIG. 5 shows a flow diagram of a method for recording context information of a measurement. The method comprises a step S1 of receiving an electrical signal and a step S2 of analyzing the received signal by a signal measurement device 11. The method further comprise a step S3 of receiving context information related to an analysis of the received electrical signal and a step S4 of generating a dataset comprising predetermined settings of the signal measurement device and the received context information. In a step S5 the generated dataset is stored in a database.

As already described above, the context information may comprise one or more voice annotations.

In order to provide the stored datasets, in particular the stored context information to a user, the method may comprise a step of receiving a selection of a dataset stored in the database and a step of reproducing at least one of the voice annotations of the selected dataset.

Summarizing, the present invention relates to an improved recording of context information for a measurement. For this purpose, it is suggested to receive context information from a user and to generate a dataset comprising the received context information. In particular, the context information may comprise one or more voice annotation. By using voice annotations for specifying context information of a measurement, a very simple and easy format for acquiring the context information from a user is achieved.

Although the present invention has been described in the above by way of preferred embodiments, it is not limited thereto, but rather can be modified in a wide range of ways. In particular, the invention can be changed or modified in various ways without deviating from the core of the invention.

The invention claimed is:

1. A measurement system for recording context information of a measurement, the system comprising:
    a signal measurement device, adapted to receive an electrical signal from a probe tip, a measurement antenna or a cable connection from a device under test, and analyze the electrical signal;
    an input device, adapted to receive context information from a user, wherein the context information specifies information in connection with the device under test that is relevant to the measurement;
    a processor, adapted to generate a single dataset comprising predetermined settings of the signal measurement device and the context information received by the input device, and to store the generated dataset.

2. The system of claim 1, wherein the generated context information comprising predetermined settings of the signal measurement device.

3. The system of claim 1, wherein the input device comprises an audio interface, adapted to receive a voice annotation from a user, and
    wherein the context information comprises the received voice annotations.

4. The system of claim 3, wherein the processor is adapted to include multiple voice annotations to a dataset.

5. The system of claim 3, comprising a microphone adapted to be connected to the input device.

6. The system of claim 3, comprising an audio interface, adapted to provide an audio signal corresponding to voice annotation of the context information.

7. The system of claim 6, comprising a loudspeaker adapted to be connected to the audio interface.

8. The system of claim 1, comprising a wireless communication interface adapted to transmit a stored dataset to a remote device or to receive a dataset from a remote device.

9. The system of claim 8, comprising a remote device adapted to perform at least one of:
    to receive context information,
    to modify context information,
    to reproduce context information,
    to transmit context information to the wireless communication interface.

10. The system of claim 1, wherein the dataset comprises a display screenshot.

11. The system of claim 1, wherein the dataset comprises measurement trace data.

12. The system of claim 1, comprising at least one of:
    an internal memory,
    a removable memory,
    a communication link to a remote memory;
    and wherein the processor is adapted to store datasets in at least one of the internal memory, the removable memory or via the communication link in the remote memory.

13. The system of claim 1, comprising a control device adapted to receive a selection of a dataset out of the stored datasets and to initiate an output of at least one piece of context information related to the selected dataset.

14. The system of claim 1, wherein the signal measurement device comprises an oscilloscope.

15. A method for recording context information of a measurement, the method comprising:
    receiving an electrical signal from a probe tip, a measurement antenna or a cable connection from a device under test;
    analyzing the received electrical signal by a signal measurement device;
    receiving context information related to the analysis of the received electrical signal, wherein the context information specifies information in connection with the device under test that is relevant to the measurement;
    generating a single dataset comprising the received context information; and
    storing the generated dataset in a database.

16. The method according of claim 15, wherein the context information comprises predetermined settings of the signal measurement device.

17. The method of claim 15, wherein the context information comprises at least one voice annotation.

18. The method of claim 17, comprising:
    receiving a selection of a dataset stored in the database; and
    reproducing at least one of the voice annotations of the selected dataset.

* * * * *